(12) United States Patent  
Cheung et al.

(10) Patent No.: US 9,510,460 B2  
(45) Date of Patent: Nov. 29, 2016

(54) METHOD FOR ALIGNING ELECTRONIC COMPONENTS

(71) Applicants: Yu Sze Cheung, Kwai Chung (HK); Yan Yiu Lam, Kwai Chung (HK)

(72) Inventors: Yu Sze Cheung, Kwai Chung (HK); Yan Yiu Lam, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 205 days.

(21) Appl. No.: 14/488,691

(22) Filed: Sep. 17, 2014

(65) Prior Publication Data

US 2016/0081198 A1    Mar. 17, 2016

(51) Int. Cl.
*B23P 19/00* (2006.01)
*H05K 3/32* (2006.01)

(52) U.S. Cl.
CPC ............ *H05K 3/32* (2013.01); *Y10T 29/53091* (2015.01); *Y10T 29/53261* (2015.01)

(58) Field of Classification Search
CPC ................ H01L 2224/7565; Y10T 29/53087; Y10T 29/53091; Y10T 29/53261

USPC .................. 29/760, 721, 739, 742, 743, 744
See application file for complete search history.

(56) References Cited

U.S. PATENT DOCUMENTS 5,233,745 A * 8/1993 Morita ............... H05K 13/0413
29/705
7,350,289 B2 * 4/2008 Narita ................ H05K 13/0413
29/739

FOREIGN PATENT DOCUMENTS

JP        2009-26936        2/2009

* cited by examiner

*Primary Examiner* — Thiem Phan
(74) *Attorney, Agent, or Firm* — Ostrolenk Faber LLP

(57) ABSTRACT

For aligning an electronic component to a required orientation, the electronic component is picked up and it is inspected while it is being held to determine its initial orientation. A précising mechanism is then rotated to correspond to the initial orientation of the electronic component. After the electronic component is secured on the précising mechanism in the initial orientation, the précising mechanism is rotated to align the electronic component to the required orientation. Thereafter, the electronic component that has been aligned to the required orientation may be picked up for further testing and/or processing.

6 Claims, 4 Drawing Sheets

METHOD FOR ALIGNING ELECTRONIC COMPONENTS

FIELD OF THE INVENTION

The invention relates to the alignment of electronic components for processing during semiconductor assembly and packaging.

BACKGROUND AND PRIOR ART

Précising mechanisms are used in high speed electronic component testing machines for aligning electronic components for testing and/or further processing. Typically, electronic components are fed to a high-speed electronic component testing machine by using a vibration bowl feeder or other conveying means. The electronic components are then separated and picked individually by a pick-head to be transferred for further downstream testing and/or processing.

In the interests of increasing processing speed, the electronic components are fed in bulk and they may be in various orientations when they are fed to the pick-head. Thus, the orientations of these separated electronic components will not be the same when they are picked up.

A précising mechanism is therefore required to correct a position of an electronic component before it is transferred to other testing or processing stations. A mechanism to adjust the electronic component is usually incorporated at the précising station, or it may be included as a separate module, in order to re-align the electronic component to the required orientation.

One type of précising mechanism comprises a plurality of jaws which are arranged at a specific orientation. This specific orientation coincides with the required orientation of the electronic components, and the said orientation of the plurality of jaws is fixed regardless of the initial orientation of the electronic component when it is fed into the précising station. Conventionally, the jaws of the précising mechanism may be positioned at four sides of the electronic components or at two corners thereof to cooperate to push the electronic components to their required orientations. After the pick-head places an electronic component onto the précising mechanism, the jaws of the précising mechanism will push the electronic component to force it to align to its required orientation.

FIG. 1 illustrates a first method of précising an electronic component according to the prior art. (i) An electronic component 10 is picked up in an unaligned orientation. (ii) The electronic component 10 is then placed on a platform 12 of a précising mechanism in the unaligned orientation. (iii) A plurality of jaws 14 of the précising mechanism will close and press onto the corners of the electronic component 10 and then the side walls thereof. When the jaws 14 close totally, the electronic component 10 is aligned in the required orientation. (iv) Once the electronic component 10 has been aligned in the required orientation, the jaws 14 will open and the aligned electronic component 10 may be picked up by a pick-head.

FIG. 2 illustrates a second method of précising an electronic component according to the prior art. The main difference between this method and the first method is that the précising mechanism comprises a pair of jaws 16 that are L-shaped. (i) An electronic component 10 is picked up in an unaligned orientation. (ii) The electronic component 10 is then placed on a platform 12 of a précising mechanism in the unaligned orientation. (iii) The jaws 16 of the précising mechanism will close and press onto the corners of the electronic component 10 and then the side walls thereof. When the jaws 16 close totally, the electronic component 10 is aligned in the required orientation. (iv) Once the electronic component 10 has been aligned in the required orientation, the jaws 16 will open and the aligned electronic component 10 may be picked up by a pick-head.

A shortcoming that is faced with these designs of the précising mechanism is that they risk damage to electronic components if the initial orientations of the electronic components deviate too much from their required orientation.

Japanese patent publication number JP2009-026936 entitled "Positioning Device" provides a positioning device which prevents a shock caused by the catching of a guide during positioning of an electronic component. It describes guide mechanisms comprising pawls which abut against side surfaces of the electronic component and guide the electronic component from four directions to correct its orientation. The guide mechanisms are configured to be opened and closed by cam plates. However, although this approach may somewhat reduce damaging the corners of the electronic component, it requires many motion steps, which increases cycle time and reduces throughput.

It would thus be beneficial to implement an efficient approach to safely align electronic components which does not employ purely mechanical means requiring many motion steps.

SUMMARY OF THE INVENTION

It is thus an object of the invention to seek to provide a mechanism which aligns an orientation of an electronic component quickly and effectively while minimizing the risk of damage to the electronic component.

According to a first aspect of the invention, there is provided a method for aligning an electronic component to a required orientation, comprising the steps of: picking up the electronic component; inspecting the electronic component to determine its initial orientation; rotating a précising mechanism to correspond to the initial orientation of the electronic component; securing the electronic component on the précising mechanism in the initial orientation; rotating the précising mechanism to align the electronic component to the required orientation; and thereafter picking up the electronic component that has been aligned to the required orientation.

According to a second aspect of the invention, there is provided an apparatus for aligning an electronic component to a required orientation, the apparatus comprising: a plurality of pick-heads for picking up electronic components; an inspection station that is operative to inspect an initial orientation of an electronic component while it is held on a pick-head; and a précising mechanism that is in operative communication with the inspection station such that the précising mechanism is rotatable to correspond to the initial orientation of the electronic component which has been determined; wherein the précising mechanism is further configured to receive the electronic component in its initial orientation and to rotate the electronic component to the required orientation.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

An example of a mechanism for aligning an orientation of an electronic component in accordance with the invention will now be described with reference to the accompanying drawings, in which.

DETAILED DESCRIPTION OF THE PREFERRED EMBODIMENT OF THE INVENTION

Figure 1:
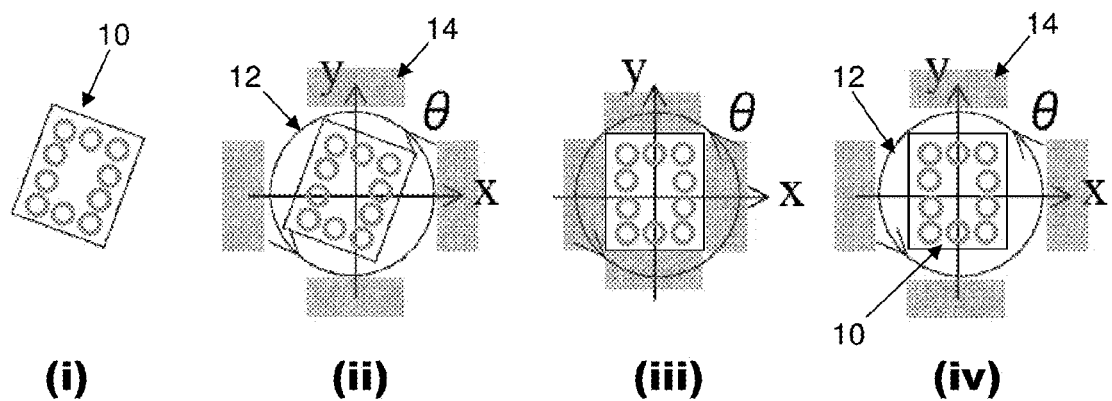
FIG. 1 illustrates a first method of précising an electronic component according to the prior art.
Figure 2:
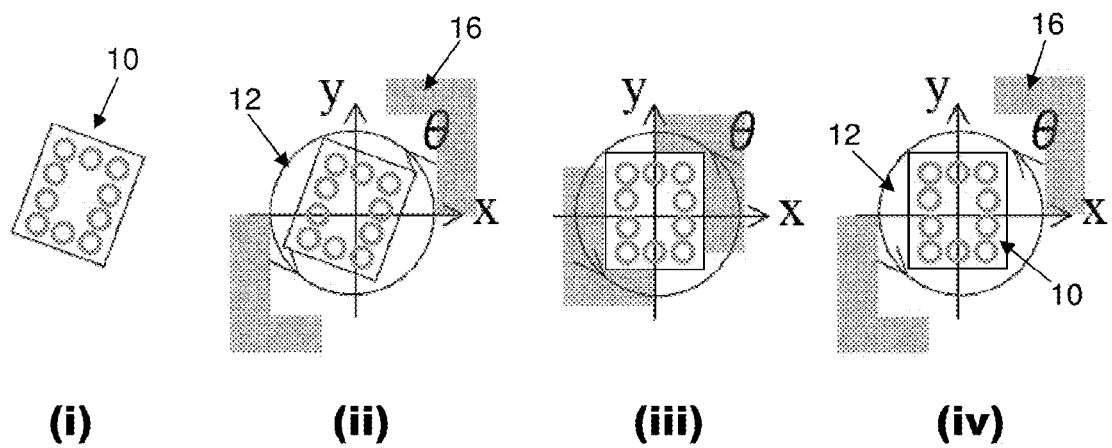
FIG. 2 illustrates a second method of précising an electronic component according to the prior art.
Figure 3:
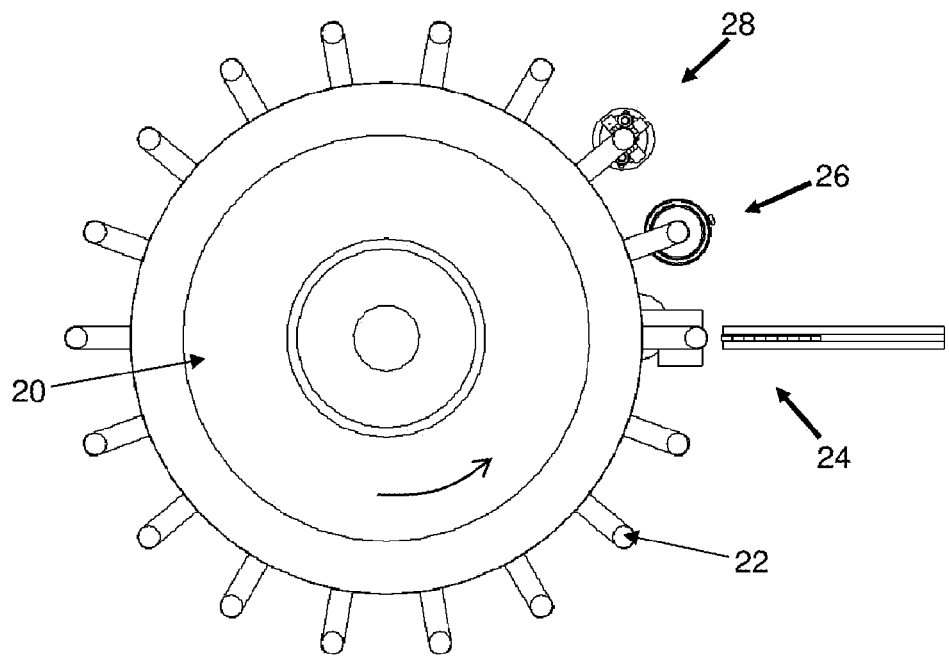
FIG. 3 is a plan view of a transfer mechanism for transferring electronic components for précising according to the preferred embodiment of the invention.

FIG. 3 is a plan view of a transfer mechanism for transferring electronic components for précising according to the preferred embodiment of the invention. A rotary turret 20 includes a plurality of pick-heads 22 arranged around its circumference. Generally, there is an in-feeding station 24, inspection station 26 and précising station 28 located adjacent to the pick-heads 22 of the rotary turret 20. As illustrated in FIG. 3, the rotary turret 20 rotates in an anticlockwise direction to deliver electronic components 10 sequentially from the in-feeding station 24 to the inspection station 26 and précising station 28, and thereafter to other testing and/or processing stations (not shown) located further downstream.

Figure 4:
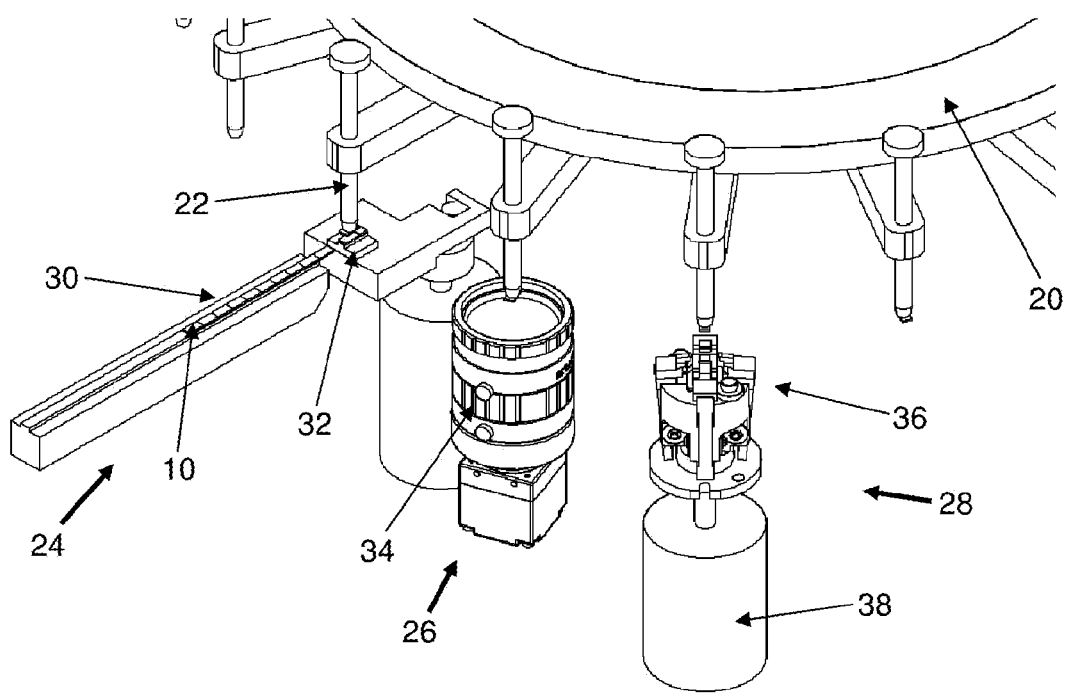
FIG. 4 is an isometric view of the transfer mechanism of FIG. 3 which includes in-feeding and précising stations associated with the transfer mechanism.

FIG. 4 is an isometric view of the transfer mechanism of FIG. 3 which includes in-feeding and précising stations 24, 28 associated with the transfer mechanism. The in-feeding station 24 comprises a conveyor 30 which transfers electronic components 10 to an in-feeding separator 32, where individual electronic components 10 are picked up by the pick-heads 22 arranged on the rotary turret 20, typically by the use of vacuum suction generated at openings of the pick-heads 22. At the in-feeding separator 32, the electronic components 10 are in variable orientations when they are picked up by the pick-heads 22.

A pick-head 22 that has picked up an electronic component 10 will be rotated by the rotary turret 20 to the inspection station 26. The inspection station 26 has an up-look camera 34 which inspects the electronic component 10 to determine an initial orientation of the electronic component 10 held by the pick-head 22.

After the orientation of the electronic component 10 has been determined, information on the orientation of the electronic component 10 is sent to a controller (not shown) which is electrically connected to the précising station 28 such that the up-look camera 34 is in operative communication with the précising station 26, which includes a précising mechanism 36. The précising station 26 is connected to a rotary motor 38, the rotary motor 38 being configured to control a rotary orientation of the précising mechanism 36. Based on the information concerning the orientation of the electronic component 10, the précising mechanism 36 is rotated by the actuation of the rotary motor 38 to a corresponding orientation which is aligned with the orientation of the electronic component 10 that has just been inspected.

After the pick-head 22 holding the electronic component 10 has been rotated by the rotary turret 20 to a position over the précising mechanism 36, the pick-head 22 places the electronic component 10 which is in its initial orientation onto the précising mechanism 36 which has been aligned by the rotary motor 38. After the electronic component 10 has been secured on the précising mechanism 36, the rotary motor 38 then rotates the précising mechanism 36 again to a required orientation of the electronic component 10, before the electronic component 10 is picked up again by the pick-head 22 in the required orientation for further processing.

Figure 5:
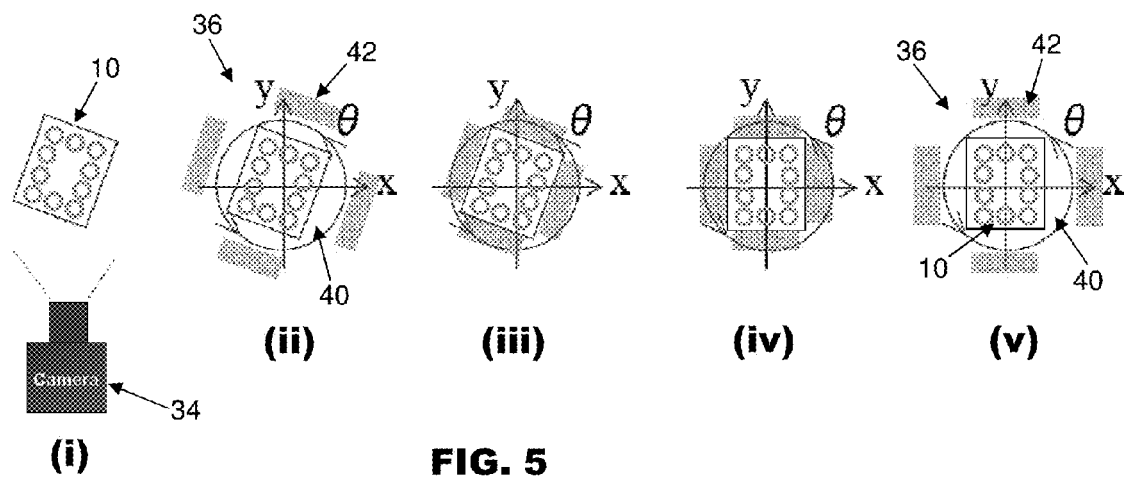
FIG. 5 illustrates a method of précising an electronic component using the transfer mechanism according to the preferred embodiment of the invention.

FIG. 5 illustrates a method of précising an electronic component 10 using the transfer mechanism according to the preferred embodiment of the invention. (i) An electronic component 10 has been picked up in an unaligned orientation, and its initial orientation while being held on a pick-head 22 in front of the up-look camera 34 is inspected by the up-look camera 34. (ii) Based on the information concerning the orientation of the electronic component 10, the précising mechanism 36 is pre-aligned with the orientation of the electronic component 10 so that when the electronic component 10 is then placed on a platform 40 of a précising mechanism, angular orientations of the jaws 42 of the précising mechanism 36 already correspond to angular orientations of side walls of the electronic component 10. (iii) The jaws 42 of the précising mechanism 36 then close and clamp directly onto the side walls of the electronic component 10 since they have already been pre-aligned. (iv) Once the electronic component 10 has been clamped by the jaws 42 of the précising mechanism 36, the précising mechanism 36 is rotated to align the electronic component 10 in the required orientation. (v) When the electronic component 10 is in the required orientation, the jaws 42 will open and unclamp the electronic component 10, and the aligned electronic component 10 may then be picked up by the pick-head 22.

Figure 6:
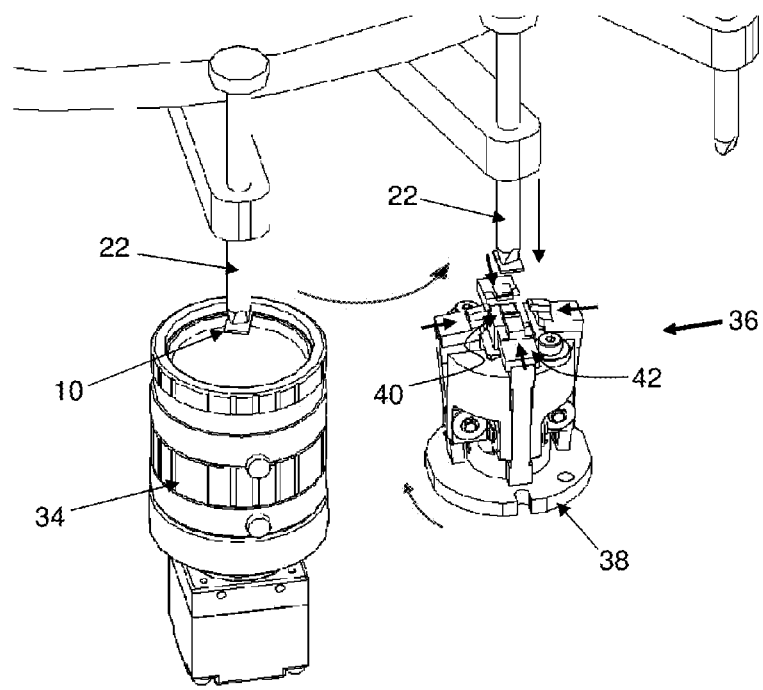
FIG. 6 is an isometric view of a précising mechanism that is pre-adjusted during transfer of an electronic component.

FIG. 6 is an isometric view of a précising mechanism 36 that is pre-adjusted during transfer of an electronic component 10. When the pick-head 22 transferring an electronic component 10 is holding the electronic component 10 above the up-look camera 34, information on an orientation of the electronic component 10 is sent to a controller, which is electrically connected to the précising station 28. Based on this information, the précising mechanism 36 is rotated as shown in FIG. 6 so that the jaws 42 of the précising mechanism 36 are aligned to the orientation of the electronic component 10 before the précising mechanism 36 receives the electronic component 10 for alignment. When the pick-head 22 is rotated to the précising station 28, the pick-head 22 places the electronic component 10 onto the platform 40 of the précising mechanism 36. Thereafter, the jaws 42 close onto the side walls of the electronic component 10 to clamp it.

Figure 7:
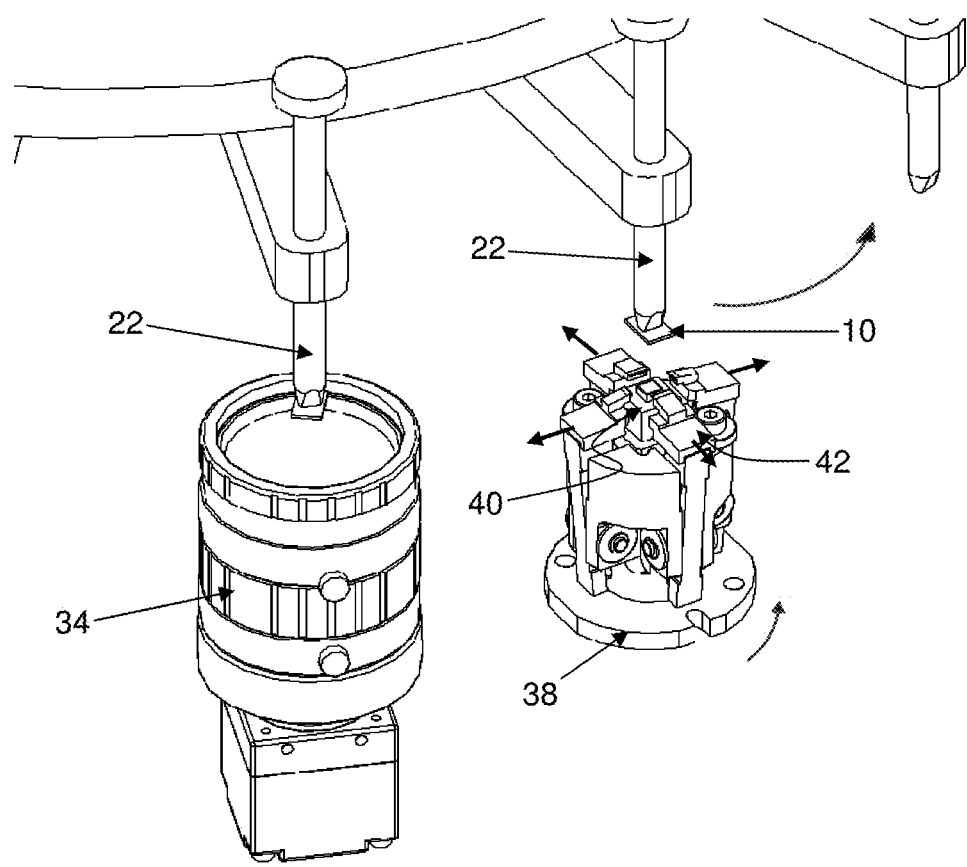
FIG. 7 is an isometric view of the précising mechanism rotating the electronic component to its required mechanism.

FIG. 7 is an isometric view of the précising mechanism 36 rotating the electronic component 10 to its required orientation. The jaws 42 then open to allow the pick-head 22 to pick up the electronic component 10 in the required orientation, and the pick-head 22 is then further moved by rotation of the rotary turret 20 to transfer the electronic component 10 for further testing and/or processing.

It should be appreciated that the preferred embodiment of the invention as described introduces an inspection station 26 to predetermine an initial orientation of an electronic component 10 prior to alignment at a précising station 28. Pre-adjustment of the précising mechanism 36 for aligning the electronic component 10 in accordance with information concerning the orientation of the electronic component 10 ensures that the jaws 42 of the précising mechanism 36 are aligned with side walls of the electronic component 10 when the jaws 42 close onto the side walls once the electronic component 10 is placed on the platform 40. This reduces the risk of damaging the corners of the electronic component 10, which may lead to chipping and/or cracking of the electronic component 10.

The invention described herein is susceptible to variations, modifications and/or additions other than those specifically described and it is to be understood that the invention includes all such variations, modifications and/or additions which fall within the spirit and scope of the above description.

The invention claimed is:

1. A method for aligning an electronic component to a required orientation, comprising the steps of:
    picking up the electronic component;
    inspecting the electronic component to determine its initial orientation;
    rotating a précising mechanism to correspond to the initial orientation of the electronic component;
    securing the electronic component on the précising mechanism in the initial orientation;
    rotating the précising mechanism to align the electronic component to the required orientation; and thereafter
    picking up the electronic component that has been aligned to the required orientation.

2. The method as claimed in claim 1, wherein the step of inspecting the electronic component to determine its initial orientation comprises the step of viewing the electronic component with a camera while the electronic component is being held in front of the camera.

3. The method as claimed in claim 2, wherein the camera is in operative communication with the précising mechanism such that the précising mechanism is rotated based on information concerning the initial orientation of the electronic component so as to correspond therewith.

4. The method as claimed in claim 1, wherein the step of rotating the précising mechanism further comprises the step of actuating a rotary motor that is operatively connected to the précising mechanism.

5. The method as claimed in claim 1, wherein the précising mechanism comprises jaws which are configured to clamp onto side walls of the electronic component, and the step of rotating the précising mechanism to correspond to the initial orientation of the electronic component further comprises the step of rotating the jaws such that angular orientations of the jaws correspond to angular orientations of the side walls of the electronic component.

6. The method as claimed in claim 5, wherein the step of securing the electronic component on the précising mechanism further comprises the step of clamping the side walls of the electronic component with the jaws, and prior to the step of picking up the electronic component that has been aligned to the required orientation, the electronic component is unclamped by the jaws.

\* \* \* \* \*